United States Patent
Ahn et al.

(10) Patent No.: US 6,627,533 B2
(45) Date of Patent: Sep. 30, 2003

(54) METHOD OF MANUFACTURING AN INSULATION FILM IN A SEMICONDUCTOR DEVICE

(75) Inventors: Sang Tae Ahn, Kyungki-do (KR); Jung Gyu Song, Kyungki-do (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/880,348

(22) Filed: Jun. 13, 2001

(65) Prior Publication Data

US 2002/0000667 A1 Jan. 3, 2002

(30) Foreign Application Priority Data

Jun. 30, 2000 (KR) .......................... 2000-37018

(51) Int. Cl.[7] .......................................... H01L 21/4763
(52) U.S. Cl. ...................... 438/623; 438/622; 438/624; 438/789; 438/790
(58) Field of Search .................... 438/622–624, 438/789–790

(56) References Cited

U.S. PATENT DOCUMENTS

| | | | | |
|---|---|---|---|---|
| 4,690,746 A | * | 9/1987 | McInerney et al. | 204/192.32 |
| 5,211,995 A | * | 5/1993 | Kuehnle | 427/570 |
| 5,510,293 A | * | 4/1996 | Numata | 438/622 |
| 5,851,603 A | * | 12/1998 | Tsai et al. | 427/579 |
| 5,962,344 A | * | 10/1999 | Tu et al. | 438/694 |
| 5,989,983 A | * | 11/1999 | Goo et al. | 438/473 |
| 6,100,202 A | * | 8/2000 | Lin et al. | 438/734 |
| 6,121,130 A | * | 9/2000 | Chua et al. | 438/623 |
| 6,207,554 B1 | * | 3/2001 | Xu et al. | 438/624 |
| 6,251,800 B1 | * | 6/2001 | Sun et al. | 438/763 |
| 6,259,133 B1 | * | 7/2001 | Gardner et al. | 257/315 |
| 6,395,092 B1 | * | 5/2002 | Sugiarto et al. | 118/695 |
| 2001/0013607 A1 | * | 8/2001 | Miyasaka | 257/66 |

FOREIGN PATENT DOCUMENTS

| | | | | |
|---|---|---|---|---|
| KR | 1998-0012077 | | 4/1998 | |
| KR | 1998-056091 | | 9/1998 | |
| TW | 382763 | * | 2/2000 | H01L/21/31 |

OTHER PUBLICATIONS

Korean Intellectual Property Office Official Action dated Jan. 21, 2003.

* cited by examiner

Primary Examiner—Phat X. Cao
Assistant Examiner—Thao X. Le
(74) Attorney, Agent, or Firm—Marshall, Gerstein & Borun LLP

(57) ABSTRACT

A method of manufacturing an insulating film in a semiconductor device is disclosed. The method comprises the steps of forming a SOD film on the entire structure to fill any distance between conductive layer patterns and after performing a curing process, forming a hard mask film on the SOD film, wherein the silicon oxide film is deposited by plasma deposition method using $SiH_4$ and $N_2O$ as a reaction gas at a low-temperature and at a low-pressure and wherein in a stabilization step, the supply amount of $SiH_4$ is greater than that of $N_2O$ and in a deposition step, the supply amount of $N_2O$ is greater than that of $SiH_4$.

4 Claims, 2 Drawing Sheets

METHOD OF MANUFACTURING AN INSULATION FILM IN A SEMICONDUCTOR DEVICE

BACKGROUND OF THE INVENTION

1. Field of the Invention

The invention relates generally to a method of manufacturing an insulating film in a semiconductor device. More particularly, the present invention relates to a method of manufacturing an insulating film in a semiconductor device, capable of improving the adhesive force and reducing the dielectric constant, in a spin-on dielectric (SOD) film and a hard mask film.

2. Description of the Prior Art

Generally, as a semiconductor device is highly integrated, the size of a conductive layer and the distance between the conductive layer patterns are reduced. As the distance between the conductive layer patterns becomes smaller, and as the capacitance between the patterns is increased, when a device is driven, the transfer of the signal is delayed, consumption of power is increased and a cross talk between lines is generated, thereby degrading the electrical characteristics of the device.

Therefore, in order to prevent degradation of the electrical characteristics of the device, use of an insulating film having a low dielectric constant is required. The insulating film involves a silicon oxide film into which carbon (C) or fluorine (F)-based ions are doped, and organic-based SOD films.

A polymer film among the SOD films is made of similar components to a photosensitive film used as an etch mask in a subsequent patterning process. In order to obtain an etching selective ratio, a hard mask film as a protective insulating film is usually formed on the SOD film. Therefore, it is required that the hard mask film have a good etching selective ratio to polymer, be possibly processed by a low-temperature process, and have a good adhesive force between polymers and a relatively low dielectric constant.

Accordingly, the hard mask film is formed using a silicon oxide film satisfying the above requirement. The silicon oxide film is usually deposited in a plasma method, wherein reaction gases such as $SiH_4$, $N_2O$, $N_2$ etc. are used which can be experienced by a low-temperature process upon deposition, so that its transformation can be prevented. The silicon oxide film used as the insulating film varies its deposition condition, that is, its dielectric constant is changed depending on the supply ratio of the reaction gases ($SiH_4$ and $N_2O$). Thus, in order to form an insulating film having a relatively low dielectric constant, the supply amount of $N_2O$ gas must be increased and the supply amount of $SiH_4$ gas must be reduced.

In this case, though the dielectric constant is reduced, a separation between the SOD film and the hard mask film occurs during a subsequent cleaning process since the adhesive force in the interface between the SOD film and the hard mask film becomes poor. It was found that the separation at the interface between the SOD film and the hard mask film is caused by oxidization of the interface of the SOD film by an oxygen atmosphere during deposition process of the hard mask film.

SUMMARY OF THE DISCLOSURE

A method of manufacturing an insulating film in a semiconductor device is disclosed which is capable of solving the aforenoted problems. Specifically, a silicon oxide film is deposited to form a hard mask film, wherein the supply amount of gas and the supply amount of a RF power are controlled, respectively, to prohibit oxidization of polymer at an early stage of the deposition process, and to reduce a dielectric constant at a later stage of the deposition process.

A disclosed method of manufacturing an insulating film in a semiconductor device comprises the steps of forming a SOD film on the entire structure to fill the distance between conductive layer patterns and after performing a curing process, forming a hard mask film on the SOD film, wherein the silicon oxide film is deposited by plasma deposition method using $SiH_4$ and $N_2O$ as a reaction gas at a low-temperature and at a low-pressure and wherein in a stabilization step, the supply amount of $SiH_4$ is greater than that of $N_2O$ and in a deposition step, the supply amount of $N_2O$ is greater than that of $SiH_4$.

Also, a method of manufacturing an insulating film in a semiconductor device is disclosed which comprises the steps of forming a first SOD film on a semiconductor device for which a given process is performed and then performing a curing process; forming a hard mask film on the first SOD film and then performing a surface process in-situ; and forming a second SOD film on the first SOD film and then performing a curing process, and then forming a second hard mask film on the second SOD film.

The first and second hard mask films are made of a silicon oxide film, wherein the silicon oxide film is deposited by plasma deposition method using $SiH_4$ and $N_2O$ as a reaction gas at a low-temperature and at a low-pressure and wherein in a stabilization step, the supply amount of $SiH_4$ is greater than that of $N_2O$ and in a deposition step, the supply amount of $N_2O$ is greater than that of $SiH_4$.

BRIEF DESCRIPTION OF THE DRAWINGS

The aforementioned aspects and other features of the disclosed methods will be explained in the following description, taken in conjunction with the accompanying drawings, wherein.

DETAILED DESCRIPTION OF THE PRESENTLY PREFERRED EMBODIMENTS

The disclosed methods and devices will be described in detail by way of a preferred embodiment with reference to accompanying drawings.

Figure 1:
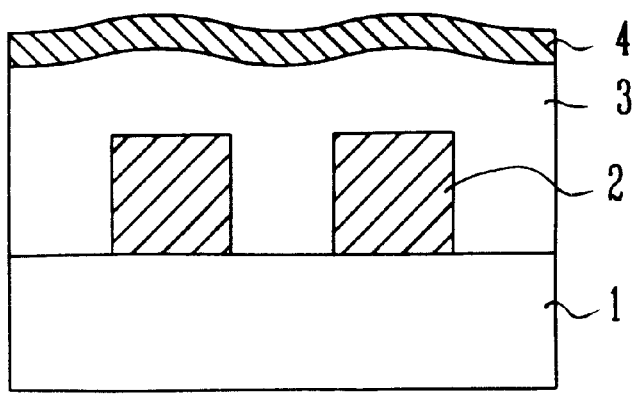
FIG. 1 is a cross-sectional view of a device for explaining a first embodiment.
Figure 2A:
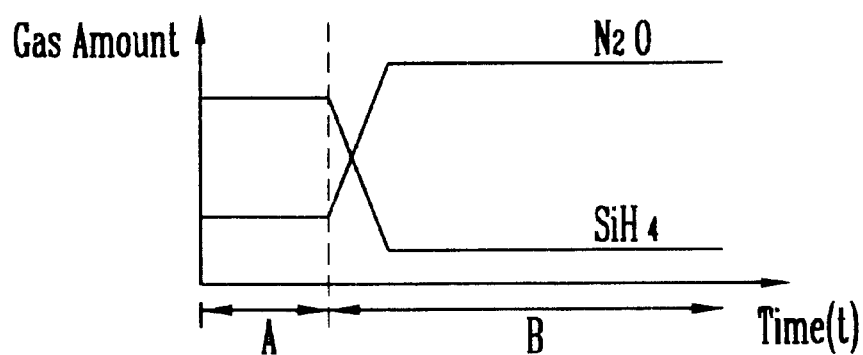
FIG. 2A illustrates, graphically, the supply amount of a reaction gas when a hard mask film in FIG. 1 is deposited.

FIG. 1 is a cross-sectional view of a device for explaining a first embodiment, which will be explained by reference to FIGS. 2A and 2B.

After conductive layer patterns 2 are formed on a semiconductor substrate 1, a SOD film 3 is formed on the entire structure to fill the gap between the conductive patterns 2. At this time, the SOD film 3 may be formed of a polymer film of C, H, 0 components, a MSQ film or a HSQ film, wherein the gap between the conductive patterns 2 is completely filled by a high fluidity of the SOD film 3 and the degree of flatness in the surface of the conductive patterns 2 becomes better.

Thereafter, a curing process is performed in the reaction furnace at a temperature ranging from about 300° C. to about 650°C. Then, a silicon oxide film is formed on the SOD film 3 by plasma deposition method using $SiH_4$ and $N_2O$ as a reaction gas under a low-temperature ranging from about 20° to about 650° C. and a low-pressure, thus forming a hard mask film 4. At this time, as shown in FIG. 2A, in the stabilization step (Period A) before plasma is generated, the silicon oxide film having the thickness ranging from about 1 Å to about 1000 Å is deposited by making the supply amount of $SiH_4$ greater than that of $N_2O$ in a state that oxidization of polymer is prohibited. On the other hand, in the deposition step (Period B) after plasma is generated, the silicon oxide film having the thickness ranging from about 100 Å to about 10000 Å is deposited by making the supply amount of $N_2O$ greater than that of $SiH_4$.

Figure 2B:
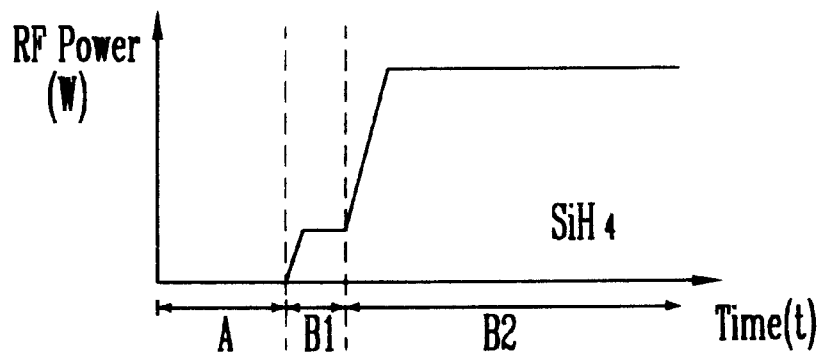
FIG. 2B illustrates, graphically, the supply amount of a plasma power when a hard mask film in FIG. 1 is deposited.

Also, as shown in FIG. 2B, the supply amount of the RF power for generating plasma is supplied for several seconds, for example, from about 1 second to about 100 seconds with a low power ranging from about 10 W to about 1000 W, at an earlier stage of plasma, that is, at an earlier stage of deposition (period B1), so that the adhesive force between the SOD film 3 and the hard mask film 4 can be increased by dangling coupling. Then, the supply amount of the RF power is increased to a range from about 100 W to about 3000 W for a time period ranging from about 10 seconds to about 200 seconds, so that the deposition speed can be increased (Period B2).

The hard mask film 4 employs a reaction gas such as TEOS, $SiH_4$, $SiC_xH_y$ (wherein 0<x and y<20), $N_2O$, $O_2$, $O_3$, etc. and an inert gas such as $N_2$, $H_2$, Ar, etc. and is formed by chemical vapor deposition method using plasma.

Figure 3A:
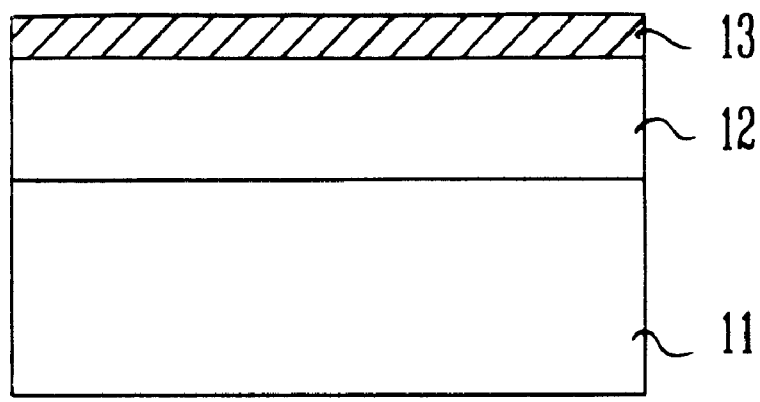
FIGS. 3A and 3B are cross-sectional views of a device for explaining a second embodiment.
Figure 3B:
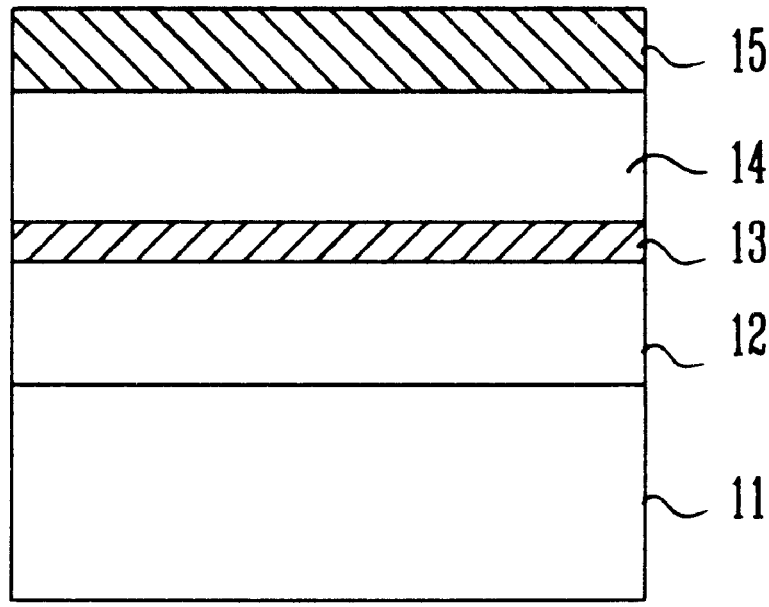

FIGS. 3A and 3B are cross-sectional views of a device for explaining a second embodiment of the present invention, which will be explained by reference to FIGS. 2A and 2B again.

Referring to FIG. 3, a first SOD film 12 is formed on a semiconductor substrate 11 for which a given process is performed. Then, a curing process is performed at the temperature ranging from about 300° to about 650° C. Next, after a first hard mask film 13 is formed on the first SOD film 12 and a surface process is then performed in-situ. The surface process is performed by plasma, wherein the plasma employs a reaction gas such as $N_2$, $NH_3$, $N_2O$, $O_2$, Ar, He, etc. and is generated by supplying a RF power of a range from about of 10 W to about 100 W.

Referring to FIG. 3B, after a second SOD film 14 is formed on the first hard mask film 13 and is then experienced by a curing process, a second hard mask film 15 is formed on the second SOD film 14. The adhesive force of the first hard mask film 13 and the second SOD film 14 are increased by the surface process using the plasma.

In the second disclosed method, the first and second SOD films 12 and 14 employ a polymer film of C, H, O components, a MSQ film or a HSQ film. Also, the first and second hard mask films 13 and 15 are formed by the same method to that of the first embodiment, respectively. That is, in the stabilization step (Period A) before plasma is generated, the silicon oxide film is deposited by making the supply amount of $SiH_4$ greater than that of $N_2O$ in a state that oxidization of polymer is prohibited, and in the deposition step (Period B) after plasma is generated, the silicon oxide film having a low dielectric constant is deposited by making the supply amount of $N_2O$ greater than that of $SiH_4$.

Further, as shown in FIG. 2B, the supply amount of the RF power for generating plasma is supplied for several seconds, for example, a time period ranging from about 1 second to about 100 seconds with a low power ranging from about 10 W to about 1000 W, at an earlier stage of plasma, that is, at an earlier stage of deposition (period B1), so that the adhesive force between the SOD film 12 or 14 and the hard mask film 13 or 15 can be increased by dangling coupling. Then, the supply amount of the RF power is instantly increased range from about 100 W to about 3000 W for a time period ranging from about 10 seconds to about 200 seconds, so that the deposition speed can be increased (Period B2).

As mentioned above, the disclosed method deposits a silicon oxide film to form a hard mask film, wherein the supply amount of gas and the supply amount of a RF power are controlled, respectively, to prohibit oxidization of polymer at an early stage of the deposition process, and to reduce a dielectric constant at a later stage of the deposition process. Also, the disclosed method forms a SOD film and a hard mask film in a multi-layer structure, wherein a surface process is performed using plasma after the hard mask film is formed.

Therefore, the disclosed methods can improve the adhesive force in the interface with the SOD film, and can also improve an electric characteristics of a device since the hard mask film having a low dielectric constant is formed.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed:

1. A method of manufacturing an insulating film in a semiconductor device, comprising:

forming a SOD film on an entire structure that comprises at least two conductive layer patterns with a distance therebetween to fill the distance between said conductive layer patterns;

performing a curing process; and forming a hard mask silicon oxide film directly on said SOD film by a plasma deposition method comprising a stabilization step followed by a deposition step, wherein the stabilization step comprises exposing the SOD film to $SiH_4$ and $N_2O$ reaction gases that are not in a plasma state wherein an amount of $SiH_4$ exceeds an amount of $N_2O$, and the deposition step is carried out by increasing the amount of $N_2O$ and decreasing the amount of $SiH_4$ so that the amount of $N_2O$ exceeds the amount of $SiH_4$ and further exposing the reaction gases to a RF power to generate a plasma.

2. The method of manufacturing an insulating film in a semiconductor device according to claim 1, wherein said SOD film is selected from the group consisting of a polymer film made of C, H and O components, a MSQ film and a HSQ film.

3. The method of manufacturing an insulating film in a semiconductor device according to claim 1, wherein said curing process is performed at a temperature ranging from about 300° C. to about 650° C. in a reaction furnace.

4. The method of manufacturing an insulating film in a semiconductor device according to claim 1, wherein said deposition step comprises a first stage followed by a second stage and the RF power for generating said plasma during said first stage is supplied for a time period ranging from about 1 second to about 100 seconds with a low power ranging from about 10 W to about 1000 W, and during the second stage the power is then increased to a range from about 100 W to about 3000 W for a time period ranging from about 10 seconds to about 200 seconds.

* * * * *